(12) United States Patent
Hsieh et al.

(10) Patent No.: US 8,467,188 B2
(45) Date of Patent: Jun. 18, 2013

(54) MODULAR HEAT-DISSIPATING DEVICE

(75) Inventors: Yi-Hwa Hsieh, Taoyuan Hsien (TW); Yao-Cheng Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 182 days.

(21) Appl. No.: 13/018,023

(22) Filed: Jan. 31, 2011

(65) Prior Publication Data
US 2011/0192568 A1    Aug. 11, 2011

(30) Foreign Application Priority Data
Feb. 10, 2010    (TW) .............................. 99104165 A

(51) Int. Cl.
*H05K 7/20*    (2006.01)
(52) U.S. Cl. .................. 361/698; 361/679.54; 361/699; 174/548
(58) Field of Classification Search ............ 361/679.46–679.54, 690, 695–705, 707–711, 714, 720
See application file for complete search history.

(56) References Cited

U.S. PATENT DOCUMENTS

| | | | |
|---|---|---|---|
| 6,989,592 B2* | 1/2006 | Chang et al. ................. | 257/707 |
| 7,839,641 B2* | 11/2010 | Baba et al. .................... | 361/711 |
| 7,885,071 B2* | 2/2011 | Huang et al. .................. | 361/700 |
| 8,149,579 B2* | 4/2012 | Jadric et al. ................... | 361/699 |
| 2007/0230127 A1* | 10/2007 | Peugh et al. .................. | 361/699 |
| 2008/0158823 A1* | 7/2008 | Tominaga et al. ............ | 361/709 |
| 2010/0208430 A1* | 8/2010 | Huang et al. .................. | 361/709 |

FOREIGN PATENT DOCUMENTS

| CN | 2925014 | 7/2007 |
|---|---|---|
| CN | 201115237 | 9/2008 |

* cited by examiner

*Primary Examiner* — Courtney Smith
(74) *Attorney, Agent, or Firm* — Kirton McConkie; Evan R. Witt

(57) ABSTRACT

A modular heat-dissipating device includes an electronic device, a cold plate and a heat-dissipating base. The electronic device includes a casing, a covering plate and a circuit board. The circuit board is disposed within the casing. Plural electronic components are disposed on the circuit board. The cold plate, the casing and the covering plate are combined together to define a sealed space. The cold plate includes plural first fixing structures. The heat-dissipating base is selected from an air-cooling member or a liquid-cooling member. Each of the air-cooling member and the liquid-cooling member includes a first slab under the cold plate and plural second fixing structures corresponding to the first fixing structures. The air-cooling member and the liquid-cooling member are normalized. The heat generated by the electronic device is transmitted to the first slab through the cold plate, and then dissipated away by the air-cooling member or the liquid-cooling member.

11 Claims, 5 Drawing Sheets

MODULAR HEAT-DISSIPATING DEVICE

FIELD OF THE INVENTION

The present invention relates to a modular heat-dissipating device, and more particularly to a modular heat-dissipating device for use in a power supply of an electric vehicle or a hybrid electric vehicle.

BACKGROUND OF THE INVENTION

Fossil fuels such as petroleum and coal are widely used in automobiles or power plants for generating motive force or electrical power. As known, burning fossil fuels produces waste gases and carbon oxide. The waste gases may pollute the air. In addition, carbon dioxide is considered to be a major cause of the enhanced greenhouse effect. It is estimated that the world's oils supply would be depleted in the next several decades. The oil depletion may lead to global economic crisis.

Consequently, there are growing demands on clean and renewable energy. Recently, electric vehicles and hybrid electric vehicles have been researched and developed. Electric vehicles and hybrid electric vehicles use an electrical generator to generate electricity. In comparison with the conventional gasoline vehicles and diesel vehicles, the electric vehicles and hybrid electric vehicles are advantageous because of low pollution, low noise and better energy utilization. The uses of the electric vehicles and hybrid electric vehicles can reduce carbon dioxide emission in order to decelerate the greenhouse effect.

As known, a power supply (e.g. an AC-to-DC charger or a DC-to-DC converter) is an essential component of the electric vehicle and the hybrid electric vehicle. For meeting the safety regulations, the power supply is usually designed as a sealed device to achieve a waterproof and dustproof purpose. It is critical to dissipate the heat generated by the electronic components of the sealed power supply.

The power supply of the electric vehicle or the hybrid electric vehicle is usually installed on the front side or rear side of the vehicle body. The heat-dissipating system used in the sealed power supply is selected according to the installing location, the heat transfer direction and the heat generation rate of the power supply. The sealed power supply usually has an air-cooling heat-dissipating system, a liquid-cooling heat-dissipating system, or both. In the air-cooling heat-dissipating system, plural fins are formed on a surface of the power supply. The heat generated by the power supply is transmitted to the fins, and radiated to the air according to a natural convection mechanism or removed away by a forced convection mechanism with a fan. In the liquid-cooling heat-dissipating system, a cooling liquid is pumped to a seal groove to remove away the heat generated by the heat source.

However, both of the air-cooling heat-dissipating system and the liquid-cooling heat-dissipating system have the disadvantages of having large volume and occupying large installing space and are inflexible to be allocated into the power supplies according to the properties of the power supplies. For example, it is not easy to dispose the air-cooling heat-dissipating system or the liquid-cooling heat-dissipating system into a narrow installing space of the power supply. Since the installing location, the heat transfer direction and the heat generation rate of the power supply is diversified, the heat-dissipating system needs to be inclusively designed. That is, the air-cooling heat-dissipating system or the liquid-cooling heat-dissipating system is previously determined in order to dissipate the heat of the power supply. The heat-dissipating system used in the sealed power supply of the electric vehicle or the hybrid electric vehicle, however, still has some drawbacks. For example, if the installing space is changed, the heat-dissipating efficacy is insufficient or the power supply is modified, the heat-dissipating system should be re-designed and reproduced. In other words, the conventional heat-dissipating system is not cost-effective.

SUMMARY OF THE INVENTION

It is an object of the present invention to provide a modular heat-dissipating device for use in a power supply of an electric vehicle or a hybrid electric vehicle, in which a normalized air-cooling member or a normalized liquid-cooling member is selected according to the practical requirements.

In accordance with an aspect of the present invention, there is provided a modular heat-dissipating device for use in an electric vehicle or a hybrid electric vehicle. The modular heat-dissipating device includes an electronic device, a cold plate and a heat-dissipating base. The electronic device includes a casing, a covering plate and a circuit board. The covering plate is disposed over the casing for shielding the casing. The circuit board is disposed within the casing. Plural electronic components are disposed on the circuit board. The cold plate, the casing and the covering plate are combined together to define a sealed space. The cold plate is disposed under the electronic device and includes plural first fixing structures. The heat-dissipating base is selected from an air-cooling member or a liquid-cooling member. Each of the air-cooling member and the liquid-cooling member includes a first slab under the cold plate and plural second fixing structures corresponding to the first fixing structures. The air-cooling member and the liquid-cooling member are normalized. The heat generated by the electronic device is transmitted to the first slab through the cold plate, and then dissipated away by the air-cooling member or the liquid-cooling member.

In an embodiment, the electronic components are disposed on a first surface of the circuit board, and the cold plate is securely attached on a second surface of the circuit board. The second surface is opposed to the first surface.

In an embodiment, the cold plate and the casing are integrally formed.

In an embodiment, a thermally-conductive medium is applied between the cold plate and the first slab for facilitating heat transfer between the cold plate and the first slab.

In an embodiment, the first fixing structures of the cold plate are aligned with the second fixing structures of the first slab, and the cold plate and the first slab are combined together via engagement between the first fixing structures and the second fixing structures.

In an embodiment, the first slab has the same area as the cold plate.

In an embodiment, the cold plate and first slab are made of a material with relatively high thermal conductivity.

In an embodiment, the air-cooling member further includes plural fins, which are disposed under the first slab.

In an embodiment, the air-cooling member further includes plural fins and a fan, which are disposed under the first slab.

In an embodiment, the liquid-cooling member further includes a box, and the first slab and the box are combined together to seal the box. The box includes a liquid inlet, a liquid outlet and a crooked groove in communication with the liquid inlet and the liquid outlet. A cooling liquid is introduced into the crooked groove through the liquid inlet to remove heat so that a heated liquid is exited from the liquid outlet.

In an embodiment, the first fixing structures of the cold plate and the second fixing structures of the first slab are engaged with each other by fastening elements so that the heat-dissipating base and the cold plate are combined together.

In an embodiment, plural third fixing structures are formed on the casing corresponding to the first fixing structures and the second fixing structures. The first fixing structures, the second fixing structures and the third fixing structures are engaged with each other by fastening elements so that the electronic device and the heat-dissipating base are combined together.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
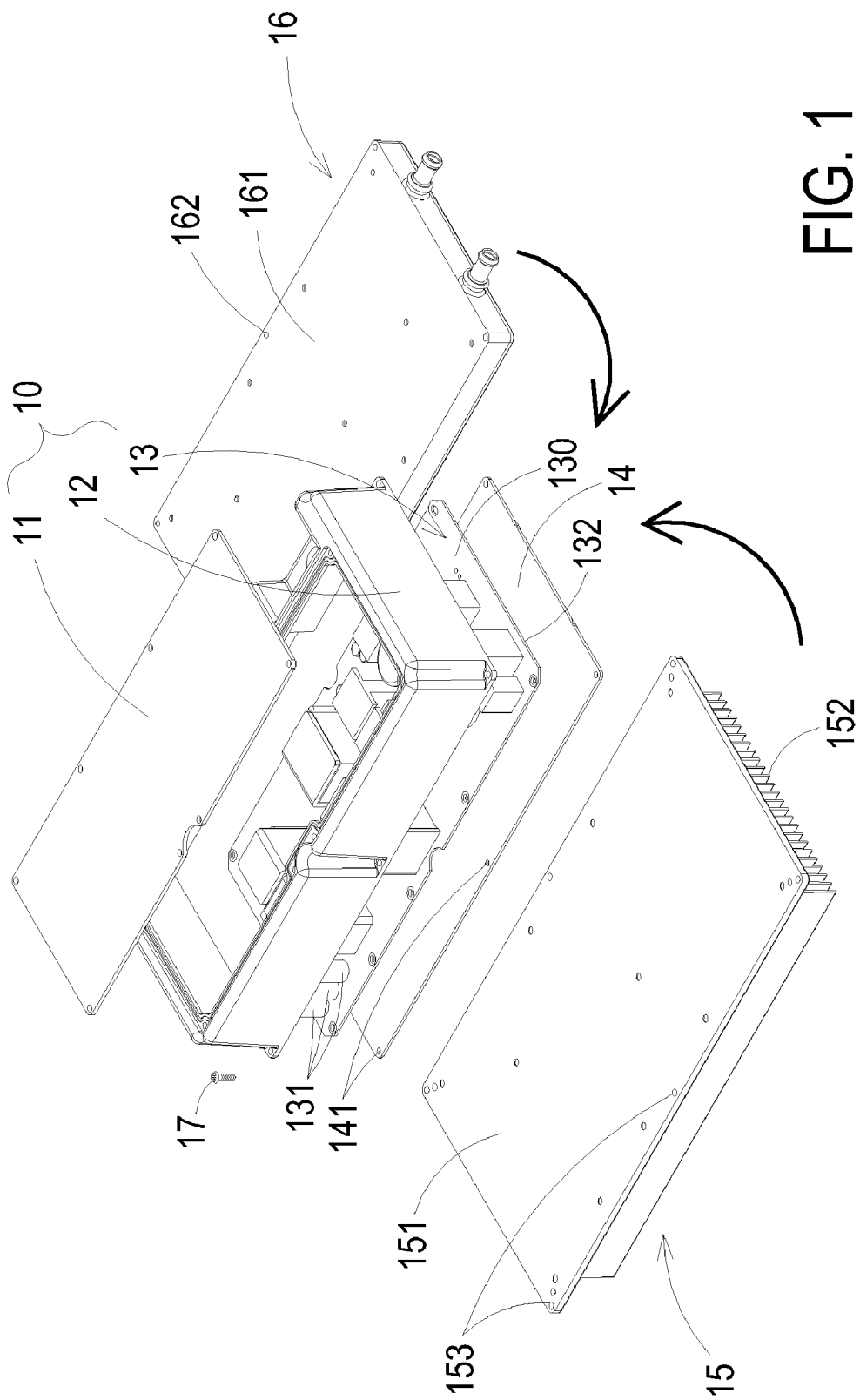
FIG. 1 is a schematic exploded view illustrating a modular heat-dissipating device according to a first embodiment of the present invention.

FIG. 1 is a schematic exploded view illustrating a modular heat-dissipating device according to a first embodiment of the present invention. As shown in FIG. 1, the modular heat-dissipating device 1 is applied to an electric vehicle and a hybrid electric vehicle. The modular heat-dissipating device 1 includes an electronic device 10, a cold plate 14 and a heat-dissipating base. The electronic device 10 includes a covering plate 11, a casing 12 and a circuit board 13. An example of the electronic device 10 is a power supply such as an AC-to-DC charger or a DC-to-DC converter. The circuit board 13 is disposed within the casing 12. The covering plate 11 is disposed over the casing 12 for shielding the casing 12. The cold plate 14, the circuit board 13, the casing 12 and the covering plate 11 are combined together to define a sealed space. Plural electronic components 131 are disposed on a first surface 130 of the circuit board 13. In this embodiment, the cold plate 14 is a flat plate. The cold plate 14 is securely attached on a second surface 132 of the circuit board 13. In addition, plural first fixing structures 141 are formed on the cold plate 14. In some embodiment, the cold plate 14 and the casing 12 can be integrally formed.

The heat-dissipating base is selected from an air-cooling member 15 or a liquid-cooling member 16. The air-cooling member 15 includes a first slab 151. The first slab 151 is disposed under the cold plate 14. Corresponding to the first fixing structures 141, plural second fixing structures 153 are formed on the first slab 151. The liquid-cooling member 16 includes a first slab 161. The first slab 161 is disposed under the cold plate 14. Corresponding to the first fixing structures 141, plural second fixing structures 162 are formed on the first slab 161. The air-cooling member 15 and the liquid-cooling member 16 are normalized. According to the practical requirements, one of the air-cooling member 15 and the liquid-cooling member 16 is selectively attached on the backside of the cold plate 14. As such, the heat generated by the electronic device 10 is transmitted from the second surface 132 of the electronic device 10 to the first slab 151 (or 161) through the cold plate 14, and then the heat is transferred by the air-cooling member 15 or the liquid-cooling member 16.

Figure 2A:
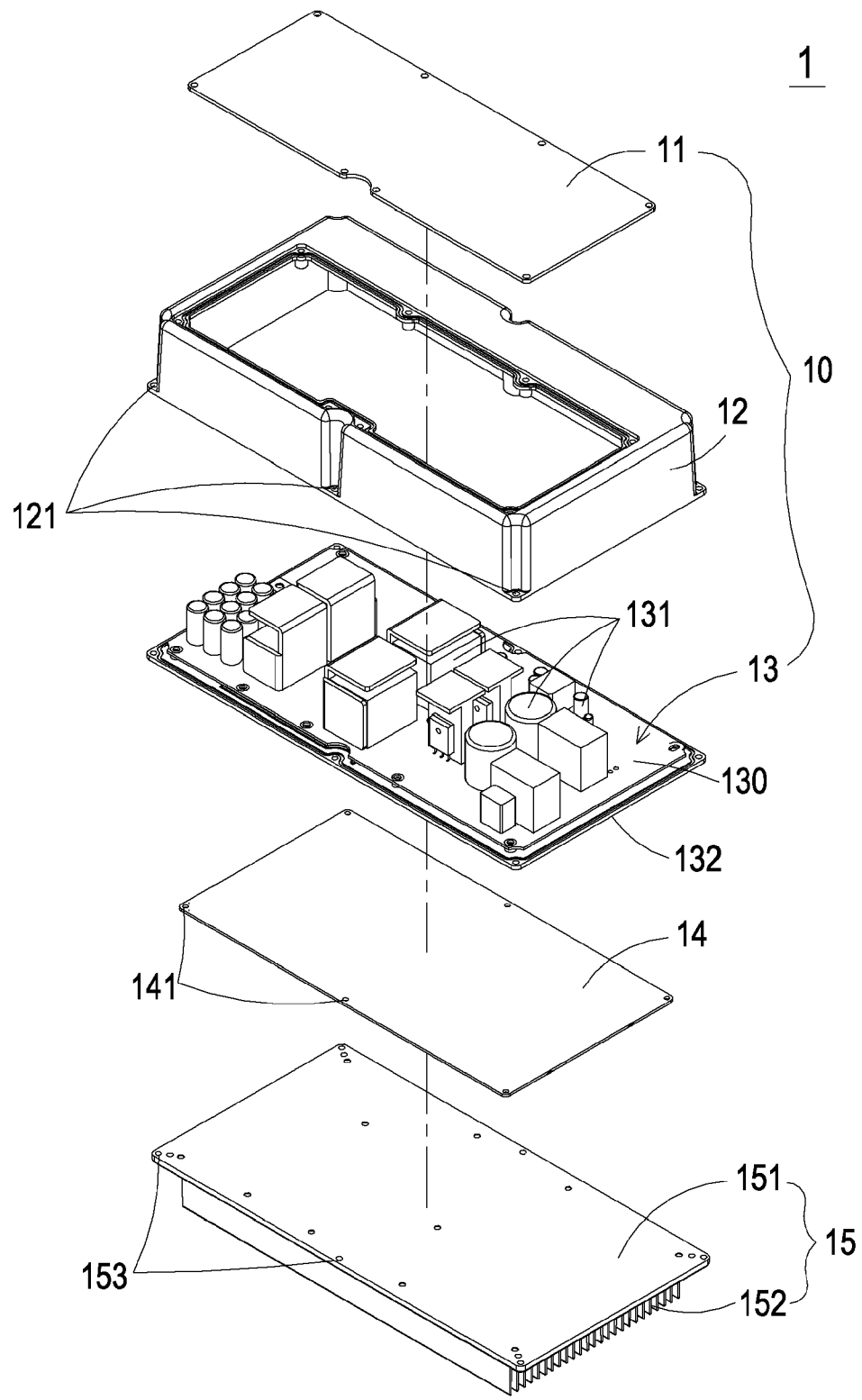
FIG. 2A is a schematic exploded view illustrating a modular heat-dissipating device of FIG. 1, in which the air-cooling member is selected as the heat-dissipating base.

FIG. 2A is a schematic exploded view illustrating a modular heat-dissipating device of FIG. 1, in which the air-cooling member is selected as the heat-dissipating base. As shown in FIG. 2A, from top to bottom, the modular heat-dissipating device 1 sequentially includes the covering plate 11, the casing 12, the circuit board 13, the cold plate 14 and the air-cooling member 15. In this embodiment, the top and bottom sides of the casing 12 are hollowed. The casing 12 is made of a metallic material with high thermal conductivity. The circuit board 13 is completely sheltered by the casing 12. The cold plate 14, the casing 12 and the covering plate 11 are combined together to define a sealed space. As such, the electronic device 10 is waterproof and dustproof. Plural electronic components 131 are disposed on the first surface 130 of the circuit board 13. The circuit board 13 further has a second surface 132 opposed to the first surface 130. Optionally, a thermally-conductive medium (not shown) is applied between the electronic components 131 and the circuit board 13, so that the heat generated by the electronic components 131 could be transmitted from the first surface 130 to the second surface 132 of the circuit board 13. In some embodiment, a thermally-conductive medium (not shown) is applied between the second surface 132 of the circuit board 13 and the cold plate 14, so that the heat could be transmitted from the second surface 132 of the circuit board 13 to the cold plate 14. An example of the thermally-conductive medium includes but is not limited to a thermally-conductive adhesive.

The cold plate 14 is disposed under the electronic device 10. The cold plate 14 is made of a material with high thermal conductivity (e.g. metallic material). The cold plate 14 is a flat plate. Plural first fixing structures 141 are formed on the cold plate 14. In some embodiments, the cold plate 14 is integrally formed with the casing 12. The air-cooling member 15 is disposed under the cold plate 14. The air-cooling member 15 includes the first slab 151 and plural fins 152. Corresponding to the first fixing structures 141, plural second fixing structures 153 are formed on the first slab 151. The first fixing structures 141 and the second fixing structures 153 have complementary profiles to be engaged with each other. For example, the first fixing structures 141 and the second fixing structures 153 are protruding blocks and indentations, respectively. Due to the engagement between the first fixing structures 141 and the second fixing structures 153, the air-cooling member 15 and the cold plate 14 are combined together. In some embodiments, the first fixing structures 141 and the second fixing structures 153 are fixing holes. By penetrating fastening elements 17 (e.g. screws, see FIG. 1) through these fixing holes, the air-cooling member 15 and the cold plate 14 are combined together. The first slab 151 and the fins 152 of the air-cooling member 15 are also made of a material with high thermal conductivity (e.g. metallic material). The number and dimension of the fins 152 are varied according to the practical requirements. In this embodiment, the heat generated by the electronic device 10 is transmitted to the fins 152 of the air-cooling member 15 through the cold plate 14, and removed away by a forced convection mechanism with a fan 154.

Figure 2B:
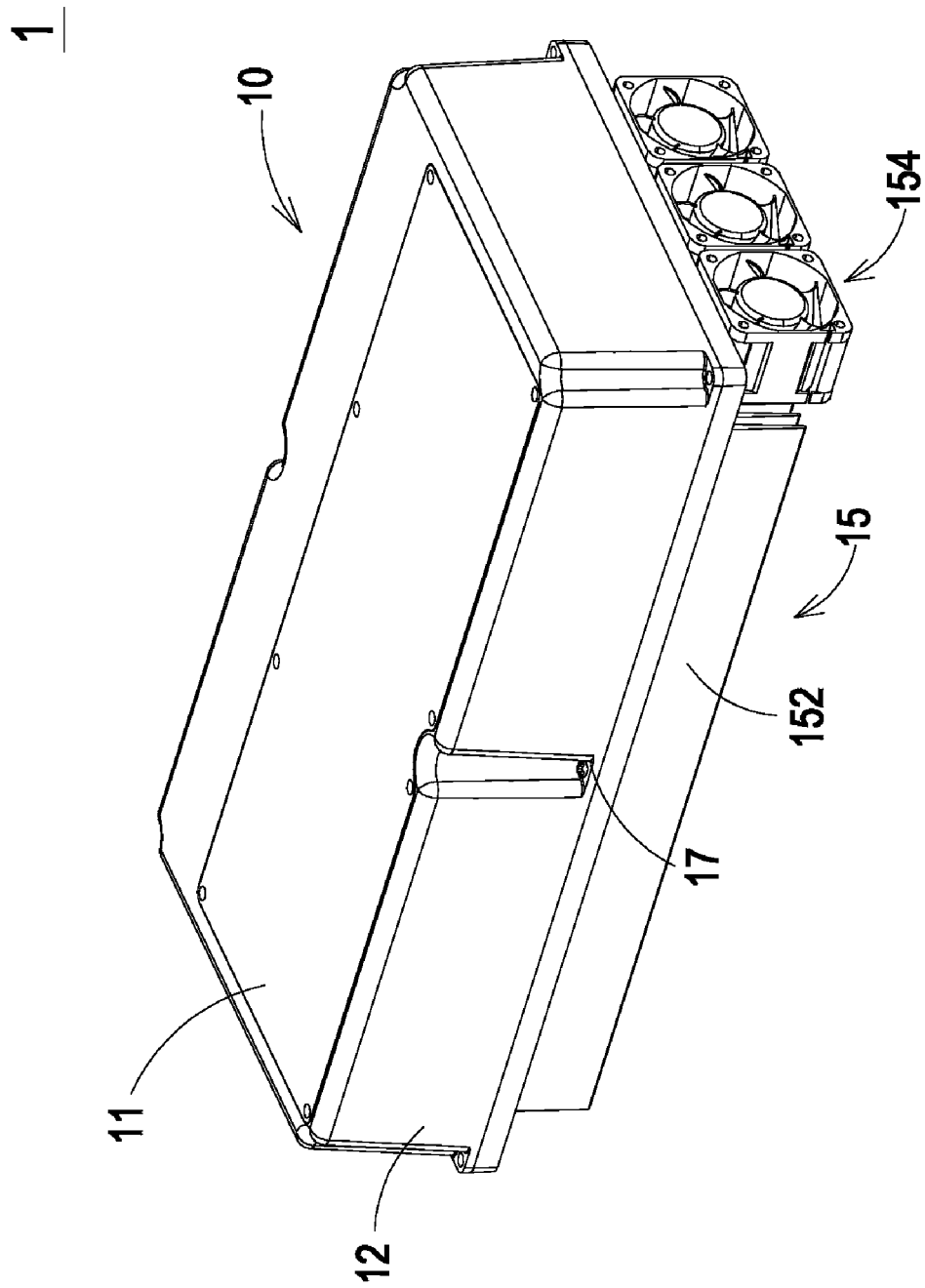
FIG. 2B is a schematic assembled view illustrating the modular heat-dissipating device of FIG. 2A.

In this embodiment, plural third fixing structures 121 (e.g. fixing holes) are formed on the casing 12 of the electronic device 10. The third fixing structures 121 are aligned with the first fixing structures 141 of the cold plate 14 and the second fixing structures 153 of the first slab 151. By penetrating fastening elements 17 through these fixing holes, the casing 12 of the electronic device 10, the cold plate 14 and the air-cooling member 15 are combined together to produce the resulting structure of the modular heat-dissipating device 1 (see FIG. 2B). By the modular heat-dissipating device 1, the waterproof and dustproof functions of the electronic device 10 are achieved. In addition, the normalized air-cooling member 15 or the normalized liquid-cooling member 16 is selected to be integrated into the modular heat-dissipating device according to the installing location, the heat transfer direction and the heat generation rate of the electronic device 10 so that the structure of the modular heat-dissipating device 1 is simplified. Since the heat-dissipating base does not need to be re-designed and reproduced, the fabricating cost is reduced. In addition, since the heat-dissipating base is selected according to the installing location, the space utilization is enhanced.

Figure 3A:
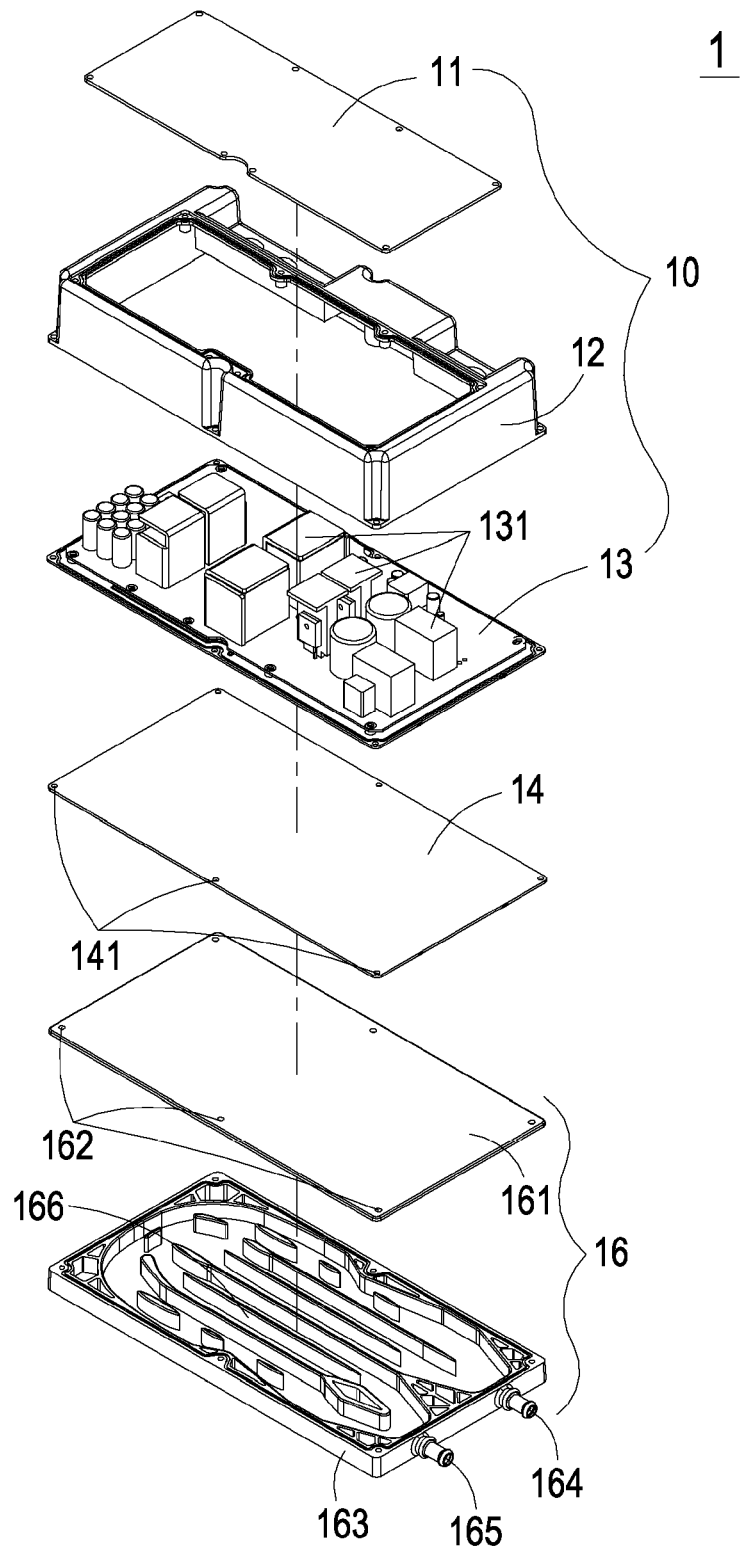
FIG. 3A is a schematic exploded view illustrating a modular heat-dissipating device of FIG. 1, in which the liquid-cooling member is selected as the heat-dissipating base.
Figure 3B:
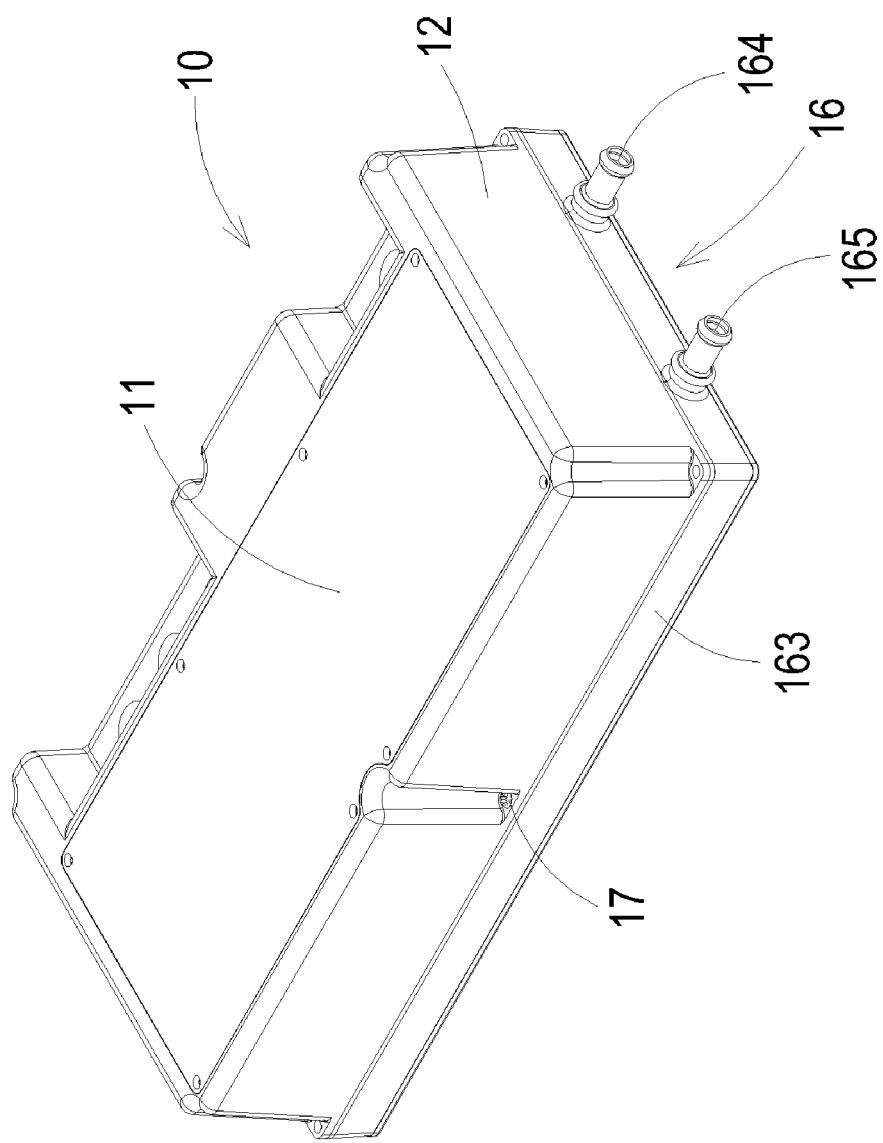
FIG. 3B is a schematic assembled view illustrating the modular heat-dissipating device of FIG. 3A.

FIG. 3A is a schematic exploded view illustrating a modular heat-dissipating device of FIG. 1, in which the liquid-cooling member is selected as the heat-dissipating base. As shown in FIG. 3A, from top to bottom, the modular heat-dissipating device 1 sequentially includes the covering plate 11, the casing 12, the circuit board 13, the cold plate 14 and the liquid-cooling member 16. The cold plate 14, the casing 12 and the covering plate 11 are combined together to define a sealed space. The process of combining the electronic device 10 with the cold plate 14 is similar to that illustrated in FIG. 2A, and is not redundantly described herein. The liquid-cooling member 16 includes the first slab 161 and a box 163. The first slab 161 and the box 163 are made of a metallic material with high thermal conductivity. Corresponding to the first fixing structures 141, plural second fixing structures 162 are formed on the first slab 161. In this embodiment, the first fixing structures 141 and the second fixing structures 162 are fixing holes. By penetrating fastening elements 17 through these fixing holes, the liquid-cooling member 16 and the cold plate 14 are combined together. As such, the electronic device 10, the cold plate 14 and the liquid-cooling member 16 are combined together to produce the resulting structure of the modular heat-dissipating device 1 (see FIG. 3B)

Please refer to FIG. 3A again. The first slab 161 and the box 163 are combined together to produce the sealed liquid-cooling member 16. In some embodiments, the first slab 161 and the box 163 are integrally formed. The box 163 includes a liquid inlet 164 and a liquid outlet 165. A crooked groove 166 is disposed within the box 163. The crooked groove 166 is in communication with the liquid inlet 164 and the liquid outlet 165. A cooling liquid (not shown) is introduced into the crooked groove 166 through the liquid inlet 164. The heat transmitted from the electronic device 10 to the first slab 161 through the cold plate 14 is removed by the cooling liquid, and a heated liquid is exited from the liquid outlet 165. In other words, the liquid-cooling member 16 may facilitate removing the heat from the electronic device 10 and the first slab 161.

Please refer to FIG. 1 again. The air-cooling member 15 and the liquid-cooling member 16 are normalized. The numbers and locations of the second fixing structures 153 and 162 of the air-cooling member 15 and the liquid-cooling member 16 correspond to the first fixing structures 141 of the cold plate 14. Via the engagement between the first fixing structures 141 and the second fixing structures 153, the air-cooling member 15 is combined with the cold plate 14. Similarly, via the engagement between the first fixing structures 141 and the second fixing structures 162, the liquid-cooling member 16 is combined with the cold plate 14. In some embodiments, the first slab 151 of the air-cooling member 15, the first slab 161 of the liquid-cooling member 16 and the cold plate 14 have the same area in order to facilitate aligning the first slab 151 (or 161) with the cold plate 14. In some embodiments, a thermally-conductive medium (not shown) is applied between the cold plate 14 and the first slab 151 (or 161) for facilitating heat transfer between the cold plate 14 and the first slab 151 (or 161). An example of the thermally-conductive medium includes but is not limited to a thermally-conductive adhesive.

In the above embodiments, a normalized heat-dissipating base is selected to be integrated into the modular heat-dissipating device according to the installing location, the heat transfer direction and the heat generation rate of the electronic device. In a case that the electronic device is installed in a seal space of an electric vehicle or a hybrid electric vehicle, the normalized air-cooling member or the normalized liquid-cooling member is selected according to the practical requirement. Since the heat-dissipating base does not need to be re-designed and reproduced, the fabricating cost is reduced. In addition, since the heat-dissipating base is selected according to the installing location, the space utilization is enhanced.

From the above description, the modular heat-dissipating device of the present invention includes a normalized heat-dissipating base (e.g. a normalized air-cooling member or a normalized liquid-cooling member), a cold plate and an electronic device. When the heat-dissipating base and the electronic device are combined together, the heat generated by the electronic components of the electronic device is transmitted to the first slab of the heat-dissipating base through the cold plate and then dissipated away by the heat-dissipating base. The modular heat-dissipating device of the present invention is easily assembled or disassembled and has simplified configurations. In other words, the process of assembling the modular heat-dissipating device is time-saving and cost-effective. Moreover, since the heat-dissipating base is selected according to the installing location, the space utilization is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A modular heat-dissipating device for use in an electric vehicle or a hybrid electric vehicle, said modular heat-dissipating device comprising:
   an electronic device comprising:
      a casing;
      a covering plate disposed over said casing for shielding said casing; and
      a circuit board disposed within said casing and comprising plural electronic components;

a cold plate disposed under said electronic device and comprising plural first fixing structures, wherein said cold plate, said casing and said covering plate are combined together to define a sealed space;

a heat-dissipating base selected from an air-cooling member or a liquid-cooling member, wherein each of said air-cooling member and said liquid-cooling member comprises a first slab under said cold plate and plural second fixing structures corresponding to said first fixing structures, and said air-cooling member and the liquid-cooling member are normalized; and a thermally-conductive medium is applied between said cold plate and said first slab for facilitating heat transfer between said cold plate and said first slab, wherein the heat generated by said electronic device is transmitted to said first slab through said cold plate, said thermally-conductive medium and then dissipated away by said air-cooling member or said liquid-cooling member.

2. The modular heat-dissipating device according to claim 1, wherein said electronic components are disposed on a first surface of said circuit board, and said cold plate is securely attached on a second surface of said circuit board, wherein said second surface is opposed to said first surface.

3. The modular heat-dissipating device according to claim 1, wherein said cold plate and said casing are integrally formed.

4. The modular heat-dissipating device according to claim 1, wherein said first fixing structures of said cold plate are aligned with said second fixing structures of said first slab, and said cold plate and said first slab are combined together via engagement between said first fixing structures and said second fixing structures.

5. The modular heat-dissipating device according to claim 1, wherein said first slab has the same area as said cold plate.

6. The modular heat-dissipating device according to claim 1, wherein said cold plate and first slab are made of a material with relatively high thermal conductivity.

7. The modular heat-dissipating device according to claim 1, wherein said air-cooling member further comprises plural fins, which are disposed under said first slab.

8. The modular heat-dissipating device according to claim 1, wherein said air-cooling member further comprises plural fins and a fan, which are disposed under said first slab.

9. The modular heat-dissipating device according to claim 1, wherein said liquid-cooling member further comprises a box, and said first slab and said box are combined together to seal said box, wherein said box includes a liquid inlet, a liquid outlet and a crooked groove in communication with said liquid inlet and said liquid outlet, wherein a cooling liquid is introduced into said crooked groove through said liquid inlet to remove heat so that a heated liquid is exited from said liquid outlet.

10. The modular heat-dissipating device according to claim 1, wherein said first fixing structures of said cold plate and said second fixing structures of said first slab are engaged with each other by fastening elements so that said heat-dissipating base and said cold plate are combined together.

11. The modular heat-dissipating device according to claim 1, wherein plural third fixing structures are formed on said casing corresponding to said first fixing structures and said second fixing structures, wherein said first fixing structures, said second fixing structures and said third fixing structures are engaged with each other by fastening elements, so that said electronic device and said heat-dissipating base are combined together.

* * * * *